(12) United States Patent
Otremba

(10) Patent No.: US 7,659,611 B2
(45) Date of Patent: Feb. 9, 2010

(54) VERTICAL POWER SEMICONDUCTOR COMPONENT, SEMICONDUCTOR DEVICE AND METHODS FOR THE PRODUCTION THEREOF

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 467 days.

(21) Appl. No.: 11/560,158

(22) Filed: Nov. 15, 2006

(65) Prior Publication Data

US 2007/0145582 A1 Jun. 28, 2007

(30) Foreign Application Priority Data

Nov. 15, 2005 (DE) .................. 10 2005 054 872

(51) Int. Cl.
*H01L 23/48* (2006.01)
(52) U.S. Cl. .................. 257/690; 257/735; 257/666; 257/676; 257/E23.001; 438/123
(58) Field of Classification Search .................. 257/690, 257/735, 666–676, E23.001; 438/123
See application file for complete search history.

(56) References Cited

U.S. PATENT DOCUMENTS

| 5,155,561 | A | 10/1992 | Bozler et al. ................ 357/22 |
| 6,803,667 | B2 | 10/2004 | Okura et al. ................ 257/792 |
| 6,995,473 | B2 | 2/2006 | Kitabatake et al. ........... 257/777 |
| 7,009,292 | B2 | 3/2006 | Miura et al. ................ 257/718 |
| 2001/0019865 | A1 | 9/2001 | Erdeljac et al. |
| 2004/0080028 | A1 | 4/2004 | Yanagisawa ................. 257/675 |
| 2004/0124474 | A1 | 7/2004 | Kitabatake et al. |
| 2005/0017291 | A1 | 1/2005 | Hirler ......................... 257/328 |
| 2005/0077599 | A1 | 4/2005 | Miura et al. |
| 2005/0215042 | A1 | 9/2005 | Hille et al. .................. 438/606 |

FOREIGN PATENT DOCUMENTS

| DE | 10324751 A1 | 1/2005 |
| DE | 102004012818 B3 | 10/2005 |
| JP | 60225457 | 9/1985 |

OTHER PUBLICATIONS

Examination Report for DE102005054872.5-33 dated Mar. 18, 2008.
Luo et al. "Using cold roll bonding and annealing to process Ti/Al multi-layered composites from elemental foils" Materials Science and Engineering (pp. 164-165), Jan. 8, 2004.
German Office Action for German Patent Application No. 10 2005 054 872.5 (6 pages), Sep. 5, 2006.

*Primary Examiner*—Wael Fahmy
*Assistant Examiner*—Tucker Wright
(74) *Attorney, Agent, or Firm*—Banner & Witcoff, Ltd.

(57) ABSTRACT

A vertical power semiconductor component (1) having a top side (3) and a rear side (4) is provided. The top side (3) has at least one first electrode contact area (8) and at least one control electrode area (9) and the rear side (4) has a second electrode contact area (7). A first metallization (10) having a thickness a is arranged on the first electrode contact area (8). A second metallization (11) having a thickness b is arranged on the control electrode area (9). A third metallization (6) having a thickness c is arranged on the second electrode contact area (7). The thickness a of the first metallization (10) is at least 10 times thicker than the thickness b of the second metallization (11).

40 Claims, 2 Drawing Sheets

VERTICAL POWER SEMICONDUCTOR COMPONENT, SEMICONDUCTOR DEVICE AND METHODS FOR THE PRODUCTION THEREOF

RELATED APPLICATION

This application claims priority from German Patent Application No. DE 10 2005 054 872.5, which was filed on Nov. 15, 2005, and is incorporated herein by reference in its entirety.

TECHNICAL FIELD

The invention relates to a vertical power semiconductor component, a semiconductor device comprising a vertical power semiconductor component, and methods for the production thereof.

BACKGROUND

In the case of vertical power semiconductor components, for example MOSFETs and IGBTs, a source or emitter electrode and a gate electrode are arranged on the front side and a drain or collector electrode is arranged on the rear side. The semiconductor component is normally supplied as a component of a packaged semiconductor device. In order to improve the functionality and reliability of the semiconductor device, it is possible to improve the semiconductor component and/or the housing and also the production methods thereof.

In the case of vertical semiconductor components, in particular in the case of vertical power semiconductor components having a low blocking capability, for example less than 100 V, the thickness of the semiconductor body is an important influencing variable for the component resistance. In one approach, the on resistance and the losses are reduced by reducing the thickness of the semiconductor body. This is normally carried out by means of a thinning by grinding process. However, this process has the disadvantage that higher losses of yield may arise since cracks may arise in the semiconductor body or the semiconductor wafer may even be broken.

DE 103 24 751 discloses a semiconductor structure with an additional stabilization layer. A stabilization layer made of metal and/or passivation material is applied on the front side of the semiconductor body prior to the thinning by grinding method. The stabilization layer improves the mechanical stability of the semiconductor structure during the thinning by grinding method and reduces the losses of yield.

The reduction of the chip volume is compensated for by the stabilization layer, so that the total thickness of the component remains approximately the same. The semiconductor material having poor electrical conductivity is thus replaced by the metal having very good electrical conductivity and the electrical properties and also the thermal properties of the semiconductor component remain unchanged.

There is still a need, however, to further improve the functionality of the packaged semiconductor device comprising a thin vertical power semiconductor component and to further simplify the production method.

SUMMARY

A vertical power semiconductor component may comprise a top side and a rear side, the top side having at least one first electrode contact area and at least one control electrode area and the rear side having a second electrode contact area, and a first metallization having a thickness a being arranged on the first electrode contact area, a second metallization having a thickness b being arranged on the control electrode area, and a third metallization having a thickness c being arranged on the second electrode contact area, wherein the thickness a of the first metallization on the first electrode contact area is at least 10 times thicker than the thickness b of the second metallization on the control electrode area.

BRIEF DESCRIPTION OF THE DRAWINGS

The invention will now be explained in more detail with reference to the accompanying figures.

DETAILED DESCRIPTION

Figure 1:
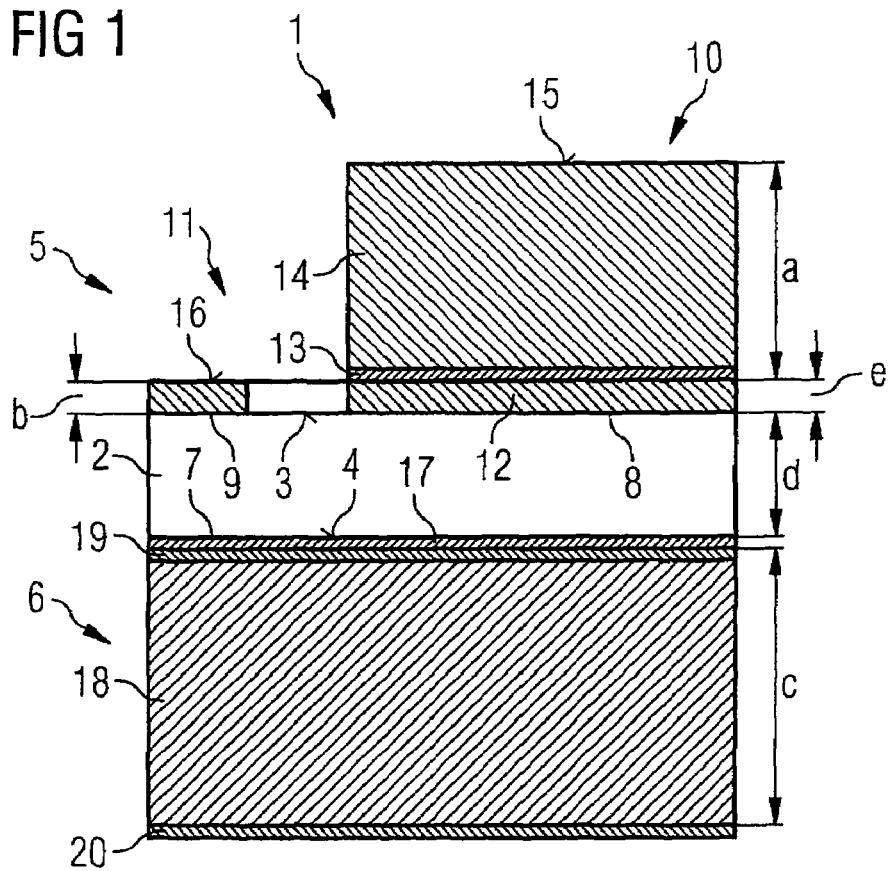
FIG. 1 shows a cross section of a power semiconductor component according to an embodiment.

A vertical power semiconductor component having a top side and a rear side is specified. The top side has at least one first electrode contact area and at least one control electrode area. The rear side has a second electrode contact area. A first metallization having a thickness a is arranged on the first electrode contact area on the top side of the power semiconductor component. A second metallization having a thickness b is arranged on the control electrode area and a third metallization having a thickness c is arranged on the second electrode contact area. The thickness a of the first metallization on the first electrode contact area is at least 10 times thicker than the thickness b of the second metallization on the control electrode area.

The vertical power semiconductor component according to an embodiment thus has a front side metallization having two regions having different thicknesses. The first metallization on the first electrode contact area is significantly thicker than the second metallization on the control electrode area. In a first embodiment, the first metallization is 10 times thicker than the second metallization. In further embodiments, the first metallization is at least 50 times or at least 100 times thicker than the second metallization.

A metallization is an electrically conductive layer which preferably comprises a metal or an alloy and which provides an electrically conductive contact with the semiconductor body of the semiconductor component.

The free surfaces of the first and second metallizations of the power semiconductor component according to an embodiment thus lie on different planes. Consequently, the free contact surfaces on which contact elements are applied also lie on different planes. This arrangement simplifies the production of the electrical connections to the contact areas of the top side of the semiconductor component. The electrical connections to the lower control electrode area can advantageously be produced first. An electrical connection to the upper metallization can then be produced in a second step. The risk of adversely affecting the prefabricated control contact elements is reduced on account of the height difference. The mounting method is thus reliable and simplified.

The smaller thickness of the second metallization on the control electrode area has the advantage that the distance between the control contact area and the circuit carrier of the device is reduced. Consequently, the length of the control contact element is reduced and the functionality of the device is increased. The advantages of a thicker front side metallization are simultaneously maintained since the thicker regions of the front side metallization can provide a stabilization layer.

The semiconductor component according to an embodiment has the further advantage that the thicker first metallization on the first electrode contact area can simultaneously specify the function of a spacer. The contact element applied on the first metallization thus lies on a plane that is further away from the top side of the body of the semiconductor component. If a contact element on the control electrode area has a height which is less than the difference in thickness between the first and second metallizations, the contact element on the first metallization may project above the contact element on the control electrode area.

The power semiconductor component according to an embodiment advantageously has an increased third metallization on the rear side of the semiconductor body of the semiconductor component. This enables a further reduction of the thickness of the semiconductor body. The disadvantages of a thin semiconductor body, namely impairment of the thermal capacity and the associated impairment of the short-time cooling or the short circuit and avalanche resistance, are compensated for by the increased thickness of the first and second metallizations.

The first metallization on the first electrode contact area may have a thickness of 10 µm≦a≦500 µm. The second metallization on the control electrode area may have a thickness of 10 nm≦b≦10 µm. The third metallization on the rear side of the semiconductor component may have a thickness of 10 nm≦c≦500 µm.

The vertical power semiconductor component has a thickness d. The thickness d is the thickness of the semiconductor body, for example of the silicon. In one embodiment, the ratio d/(a+c) is less than 1. This ratio is the ratio between the thickness d of the semiconductor body and the sum of the thicknesses of the first and third metallizations.

In contrast to the semiconductor component according to an embodiment, the ratio d/(a+c) lies within the range of 2 to 500 in the case of power semiconductor components that do not have a semiconductor body that has been ground thin. These semiconductor components have for example a silicon thickness of 1 µm to 500 µm and a front side metallization and rear side metallization each having a thickness of 10 nm to 10 µm.

In one embodiment, the thickness d of the semiconductor body is 1 µm≦d≦1000 µm, preferably 1 µm≦d≦100 µm.

In a further embodiment, a diffusion solder layer is arranged on the outer surface of the third metallization on the second electrode contact area. This enables the semiconductor component to be mounted on a circuit carrier by means of a diffusion solder method.

A diffusion solder connection has the advantage that the connection produced has a higher melting point than the melting point of the diffusion solder itself and consequently than the production temperature. The diffusion solder connection is thus thermally stable at higher temperatures. A reliable mechanical and electrical connection is consequently provided.

In a further embodiment, the first metallization has two layers, namely an intermediate layer and a contact layer. The intermediate layer is arranged directly on the top side of the semiconductor body of the semiconductor component and the contact layer is arranged directly on the intermediate layer. The free surface of the contact layer provides the free surface of the first metallization. In one embodiment, the contact layer is at least 10 times thicker than the intermediate layer. In further embodiments, the contact layer is at least 50 times or at least 100 times thicker than the intermediate layer.

The third metallization may also have two layers, namely an intermediate layer and a contact layer. The intermediate layer is arranged directly on the rear side of the semiconductor body of the semiconductor component and the contact layer is arranged on the intermediate layer. The free surface of the contact layer provides the free surface of the third metallization. The contact layer is at least 10 times thicker than the intermediate layer. In further embodiments, the contact layer is at least 50 times or at least 100 times thicker than the intermediate layer.

In one embodiment, the intermediate layer has a thickness e, where 10 nm≦e≦10 µm. The intermediate layer may advantageously have approximately the same thickness as the thickness of the second metallization of the control electrode area. Consequently, the intermediate layer of the first metallization and the second metallization can be applied simultaneously in the same method. In this embodiment, the intermediate layer of the first metallization and the second metallization thus have the same composition.

In one embodiment, the contact layer is mounted on the intermediate layer by means of a diffusion solder connection. The diffusion solder layer thus has intermetallic phases and may have an Sn-based diffusion solder, for example CuSn, AuSn or AgSn. The contact layer may have the form of a metal foil which is electrically and mechanically connected to the intermediate layer via the diffusion solder connection. In this embodiment, the metallization has an intermediate layer arranged on the semiconductor body, a diffusion solder layer arranged on the intermediate layer, and a contact layer arranged on the diffusion solder layer. The first and/or the second metallization may have this structure.

The intermediate layer may have one or more of the elements Ti, Cr, Al, Ni, Au, Ag. These elements provide a reliable connection and a low-resistance contact with a semiconductor body made of silicon. The second metallization may also have one or more of the elements Ti, Cr, Al, Ni, Au, Ag. The contact layer may have Cu or a copper alloy.

The vertical power semiconductor component may be a MOSFET (Metal Oxide Field Effect Transistor) or an IGBT (Isolated Gate Bipolar Transistor) or a BJT (Bipolar Junction Transistor). In the case of a MOSFET power semiconductor component, the first electrode contact area is a source electrode, the control electrode area is a gate electrode and the second electrode contact area is a drain electrode. In the case of an IGBT power semiconductor component, the first electrode contact area is an emitter electrode, the control electrode area is a gate electrode, and the second electrode contact area is a collector electrode. In the case of a BJT power semiconductor component, the first electrode contact area is an emitter electrode, the control electrode area is a base electrode and the second electrode contact area is a collector electrode.

The present specification also relates to semiconductor devices and provides a semiconductor device having at least one vertical power semiconductor component according to one of the preceding embodiments. The semiconductor device furthermore has a circuit carrier and a plurality of contact elements. The circuit carrier has at least one chip island, at least one control lead, at least one first lead and at least one second lead. The rear side of the vertical power semiconductor component is mounted on the chip island. The first electrode contact area is electrically connected to the first lead and the control electrode area is electrically connected to the control lead via the contact elements.

The second lead may project from the chip island. As an alternative, the rear side of the chip island may form the second lead. The arrangement of the leads of the circuit carrier may satisfy a known standard such as a JEDEC standard.

In the case of a MOSFET semiconductor component, the first lead is the source terminal, the second lead is the drain terminal and the control lead is the gate terminal. The arrangement of the metallization of the top side of the semiconductor component according to an embodiment has the advantage that the first metallization has the function of a contact electrode and also of a spacer. This simplifies the construction of the semiconductor device since an additional spacer can be dispensed with.

Owing to the different thickness of the first metallization of the first electrode contact area and the second metallization of the control electrode area, the top side of the semiconductor component can be electrically connected to the circuit carrier more simply and more reliably. In particular, the use of bonding wires and contact clips as contact elements in a semiconductor device is simplified since the significantly thicker first metallization of a contact surface lies on a different plane with respect to the control electrode area. Consequently, a contact element, for example a contact clip, can be applied on the elevated first metallization after the contact-connection of the control electrode area, for example by means of bonding wires, without the control contact element being impaired.

The front side metallization according to an embodiment has the further advantage that the length of the control contact elements remains short, so that the functionality of the semiconductor device remains high. At the same time, the boundary between the first contact element and the first metallization can be enlarged since the risk of short circuits with the control contact elements is reduced. Consequently, a lower electrical contact resistance is specified and the functionality of the device is improved further.

In one embodiment, the first electrode contact area is electrically connected to the first lead by means of a contact clip. The first electrode contact area is a power contact area and, consequently, the contact resistance can be reduced by the large contact area of a contact clip.

The control electrode area may be electrically connected to the control lead by means of at least one bonding wire. A bonding wire has the advantage that a small diameter and a small electrical resistance can reliably be provided, with the result that the functionality of the device is improved.

In one embodiment, the contact element extending between the first electrode contact area and the first lead lies above at least one contact element extending between the control electrode area and the control lead. This arrangement is made possible by the different thickness of the first and second metallizations. The upper contact element arranged on the first metallization thus projects beyond the contact element on the control electrode area. This has the advantage that it is possible to increase the contact area between the upper contact element and the first metallization. The contact-connection method is also simplified since the possible impairment of the control contact element during the contact-connection of the first metallization is reduced. Furthermore, the arrangement of the contact device is more flexible since the surface to be connected lies at a higher level than that of the control contact elements produced beforehand.

The contact clip may have a flat region and a leg projecting beyond the latter. In this exemplary embodiment, the free end of the flat region lies above the lower control contact element. As an alternative, the upper contact clip may have two opposite legs, so that the contact clip completely covers the lower contact element.

The semiconductor device may furthermore have a plastic housing composition for the protection of the device, said plastic housing composition surrounding the power semiconductor component and at least in part the contact elements. The semiconductor device may furthermore have a JEDEC housing, so that the device can be mounted more simply in known systems and on known printed circuit boards.

The plastic housing composition also provides for electrical insulation of the contact elements, with the result that short circuits between the latter can be prevented.

The present specification also relates to a method for producing a vertical power semiconductor component, having the following steps. At least one semiconductor component having a top side and a rear side is provided. The top side of the semiconductor component has at least one first electrode contact area and at least one control electrode area. A first metallization having a thickness a is applied on the first electrode contact area. A second metallization having a thickness b is applied on the control electrode area, the thickness a of the first metallization being at least 10 times thicker than the thickness b of the second metallization. The thickness of the semiconductor body is reduced to a thickness d by removal of the surface of the rear side of the semiconductor chip. A third metallization having a thickness c is applied on the rear side of the semiconductor chip.

The semiconductor component is advantageously provided in the form of a semiconductor wafer. The wafer has a plurality of semiconductor components arranged in rows and columns. The first and second metallizations are applied on the top side of the wafer, so that the front side metallization according to an embodiment is simultaneously applied to a plurality of semiconductor components. After the third metallization has been applied on the rear side of the wafer, the wafer is singulated in order to provide a plurality of semiconductor components.

The first and second metallizations may be produced by patterning an applied closed layer. As an alternative, the first and second metallizations may be produced by selective application by means of patterned masks.

The first metallization may be applied with a thickness of $10\ \mu m \leqq a \leqq 500\ \mu m$, the second metallization may be applied with a thickness of $10\ nm \leqq b \leqq 10\ \mu m$ and the third metallization may be applied with $10\ nm \leqq c \leqq 500\ \mu m$.

In one embodiment, the semiconductor body is reduced to a thickness d, so that the ratio $d/(a+c)$ is less than 1. In a further embodiment, the semiconductor body is reduced to a thickness d, where $1\ \mu m \leqq d \leqq 1000\ \mu m$, preferably $1\ \mu m \leqq d \leqq 100\ \mu m$.

The method according to an embodiment may have the additional step in which a diffusion solder layer is applied on the outer surface of the third metallization on the second electrode contact area. The diffusion solder layer may have an Sn-based diffusion solder, for example AgSn, AuSn or CuSn, and is advantageously applied on the rear side of a wafer with a plurality of semiconductor components. The diffusion solder layer may have a thickness of from 0.1 μm to 10 μm. The semiconductor component produced can be mechanically and electrically connected in a simple manner by means of a diffusion solder method on a circuit carrier. No additional adhesive is necessary and a thermally stable connection is produced.

In one embodiment, an intermediate layer and a contact layer are applied as the first metallization. The contact layer is at least 10 times thicker than the intermediate layer. The intermediate layer is advantageously applied in the same process step as the second metallization. The contact layer is then applied to the intermediate layer of the first electrode contact area. The contact layer can be applied at the wafer level or on the singulated semiconductor component.

An intermediate layer and a contact layer may be applied as the third metallization, the contact layer being at least 10 times thicker than the intermediate layer.

In one embodiment, the intermediate layer of the first and/or second metallization is applied with a thickness e, where it may be the case that 10 nm≦e≦10 μm.

In one embodiment, the second metallization and the intermediate layer are applied by means of vapor deposition or sputtering. This produces a good mechanical and electrical connection between the deposited metal or the metals and the semiconductor body, for example silicon.

The contact layer of the first metallization and the contact layer of the third metallization may be applied in the form of a foil. The foil can be produced by means of a cold rolling method and can be produced from a laminate structure of two or more metals in order to specify an alloy foil. A foil has the advantage that it can be applied to a prefabricated vertical power semiconductor component. This makes it possible to use known methods and power semiconductor components up to the production of the elevated first and third metallizations. The production costs are thus reduced.

The foil may be applied by means of diffusion solder on the intermediate layer of the second metallization and/or on the intermediate layer of the third metallization. For this purpose, a diffusion solder layer may be applied on the free surface of the intermediate layer prior to the mounting of the foil.

As an alternative, it is possible to provide a foil having a diffusion solder layer on its surface to be connected. This enables the foil to be applied in a simple manner on a power semiconductor component having a first electrode contact area and a control contact area having approximately the same thickness. In both cases, the diffusion solder layer may have a thickness of from 0.1 μm to 10 μm. The diffusion solder layer may have an Sn-based diffusion solder and may have AgSn, AuSn or CuSn.

The diffusion solder layer between the contact layer and the intermediate layer may have the same composition as or a different composition than the diffusion solder layer which is arranged on the free outer surface of the third metallization.

The connection produced between the intermediate layer and the contact layer may advantageously have a higher melting point than the production temperature of the connection between the third metallization and the circuit carrier. This has the advantage that the connection between the intermediate layer and the contact layer remains thermally stable during the mounting of the semiconductor component on the circuit carrier.

The present specification also provides a method for producing a semiconductor device, having the following steps. At least one vertical power semiconductor component according to one of the previous embodiments is provided. A circuit carrier having at least one chip island, at least one control lead, at least one first lead and at least one second lead is provided. The circuit carrier may be a leadframe. The rear side of the power semiconductor component is mounted onto the chip island and mechanically and electrically connected to the chip island. Electrical connections are produced between the power semiconductor component and the leadframe. The first electrode contact area is electrically connected to the first lead and the control contact area is electrically connected to the control lead by means of contact elements.

The control electrode area is advantageously firstly electrically connected to the control lead. Afterward, the first metallization is electrically connected to the first lead of the circuit carrier. This order has the advantage that the method for producing the upper contact element does not affect or influence the lower contact element.

In one embodiment, the rear side of the power semiconductor component is mounted on the chip island by means of a diffusion solder connection.

The control electrode area may be electrically connected to the control lead by means of at least one bonding wire. If a plurality of control electrode areas are provided, each control electrode area may be electrically connected to the respective lead by means of one or more bonding wires. The first electrode contact area may be electrically connected to the first lead by means of a contact clip.

In one embodiment, the contact elements are arranged in such a way that the contact element extending between the first electrode contact area and the first lead lies above at least one contact element extending between the control contact area and the control lead. The upper contact element arranged on the first metallization thus projects beyond the contact element arranged on the control electrode area.

In a further method step, the power semiconductor component and the contact elements are at least partly embedded in a plastic housing composition.

According to an embodiment, a front side metallization for power semiconductor components which has an elevated metallization selectively on the power electrode is provided. This arrangement has the advantage that the power metallization simultaneously fulfills the function of a spacer. Furthermore, the blocking capability of the power semiconductor component can be reduced since the volume of the semiconductor body of the semiconductor component is replaced by the thick metallization. Embodiments can be used particularly advantageously in the case of power transistors having a blocking capability of less than 100 V.

FIG. 1 shows a cross section of a vertical power semiconductor component 1 according to an embodiment of a semiconductor wafer. The wafer (not shown here) has a plurality of power semiconductor components arranged in rows and columns.

The semiconductor component 1 has a semiconductor body 2 made of silicon, which has a top side 3 and a rear side 4. Furthermore, the semiconductor component 1 has an electrically conductive front side metallization 5 arranged on the top side 3 of the semiconductor body 2, and an electrically conductive rear side metallization 6 arranged on the rear side 4 of the semiconductor body 2.

The semiconductor component 1 is a vertical MOSFET component. The rear side 4 of the semiconductor body 2 provides the drain electrode area 7. The source electrode area 8 and gate electrode area 9 are situated on the top side 3 of the semiconductor body 2.

According to an embodiment, the front side metallization 5 has two regions having different thicknesses. The first region 10 is arranged on the source electrode area 8 and has a thickness a, which is 150 μm in this embodiment. The second region 11 is arranged on the gate electrode area 9 and has a thickness b, which is 5 μm in this embodiment. Consequently, the first region 10 is approximately 30 times thicker than the second region 11. The significantly thicker metallization 10 on the source electrode area 8 has the advantage that said first region 10 functions as a spacer and also as an electrically conductive contact area.

The thickness of the rear side metallization 6 does not change significantly. The rear side metallization 6 has a thickness c, which is 150 μm in this embodiment. The semiconductor body 2 has a thickness d, which is 50 μm in this embodiment. The ratio between the thickness d of the semiconductor body 2 and the sum of the thickness a of the first region 10 of the front side metallization 5 and the thickness c of the rear side metallization 6 (d/(a+c)) is thus ⅙.

The second region 11 of the front side metallization 5 provides the gate electrode contact and has Ti since titanium provides a low-resistance electrical contact with the silicon of the semiconductor body 2. The second region 11 may have two or more layers in further embodiments that are not shown here. These structures have the advantage that the material of the upper layer can be selected in order to specify a good electrical connection to a contact element, for example a bonding wire, while the material of the lower layer is selected in order to specify a low-resistance contact with the silicon.

The second region 10 of the front side metallization 5 provides the source electrode contact. In this embodiment, the second region 10 has three layers. A first intermediate layer 12 is arranged on the source electrode area 8 of the semiconductor body 2 of the vertical power semiconductor component 1. The intermediate layer 12 has a thickness b and comprises the same material as the second region 11 of the front side metallization 5, which forms the gate electrode contact. The intermediate layer 12 thus specifies a low-resistance contact with the silicon of the semiconductor body 2. The intermediate layer 12 and the second region 11 were produced in the same deposition method and thus essentially have the same thickness.

A connecting layer 13 is arranged on the top side of the intermediate layer 12 and has intermetallic phases which are the reaction products of an Sn-based diffusion solder. The second region 10 also has a contact layer 14 mounted on the intermediate layer 12 above the connecting layer 13. The contact layer 14 is thus electrically connected to the source electrode contact area 8. The outer surface 15 of the contact layer 14 of the first region 10 of the front side metallization 5 provides the source contact area.

In this embodiment, the contact layer 14 has a copper foil. The lower side of the copper foil was coated with a diffusion solder layer and applied on the intermediate layer 12. A diffusion solder method was carried out in order to mechanically and electrically connect the copper foil to the intermediate layer 12 and consequently the source electrode area 8. The connecting layer 13 therefore has intermetallic phases which are the reaction products of the diffusion solder layer and the intermediate layer and/or the contact layer 14.

The first region 10 of the front side metallization 5 is thus significantly thicker than the second region 11. The free surface 15 of the first region and the free surface 16 of the second region lie on different planes. Consequently, the first region 10 of the front side metallization 5 is simultaneously a mechanical spacer and an electrically conductive contact area.

In this embodiment, the rear side metallization 6 also has three layers. An intermediate layer 17 is arranged on the drain electrode area 7 and has titanium and thus provides a good adhesion and also a low-resistance contact with the silicon of the semiconductor body 2. A copper foil provides an outer contact layer 18, which is mechanically and electrically connected to the intermediate layer 17 and the semiconductor body via a diffusion solder connection 19.

A diffusion solder layer made of AgSn 20 is arranged on the lower surface of the contact layer 18 and thus provides the free connecting surface 21 of the power semiconductor component 1. The diffusion solder layer 20 has a thickness of 2 μm and enables, by means of a diffusion solder method, the mechanical connection of the semiconductor component 1 on a leadframe and the electrical connection of the drain electrode area 7 to the circuit carrier by means of the production of intermetallic phases in the diffusion solder layer 20.

The intermediate layer 13 and the second region 11 of the front side metallization 5 are deposited on the top side of the semiconductor body 2 by means of sputtering. The closed layer was patterned in order to form the insulated electrode areas on the top side 3. The thickness of the semiconductor body 2 is then reduced by thinning the rear side of the semiconductor body by grinding. The intermediate layer 17 of the rear side metallization 6 is deposited on the rear side 4 of the semiconductor body 2 in order to form the drain electrode contact area 7.

A diffusion solder layer is applied to the source electrode contact area and to the drain electrode contact area. A plurality of copper foil laminae are provided which correspond to the size of the source electrode contact area and that of the drain electrode contact area. The copper foil laminae are applied to the corresponding electrode contact areas and a diffusion solder method is carried out in order to mechanically and electrically connect the foil to the electrode contact areas.

The contact layers 14 and 18 can be applied to the intermediate layers 13 and 17 of the top side and the rear side, respectively, of the wafer. As an alternative, the wafer can be singulated and the foils which form the contact layers 14 and 18 can subsequently be applied on the top side and rear side of the singulated semiconductor components 1.

Figure 2:
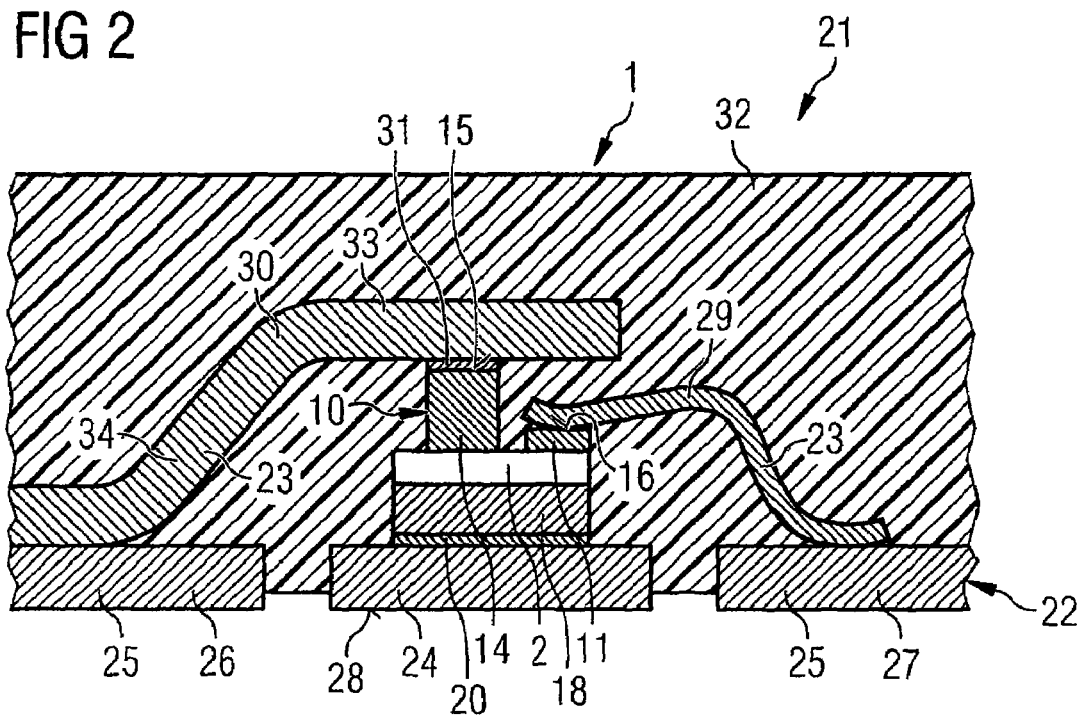
FIG. 2 shows a cross section of a semiconductor device comprising a power semiconductor component according to an embodiment.

FIG. 2 shows a cross section of a section of a semiconductor device 21 comprising a vertical power semiconductor component 2 with a metallization structure according to an embodiment, a circuit carrier 22 and contact elements 23.

The circuit carrier 22 is a leadframe having a chip island 24 and a plurality of leads 25 surrounding the chip island 24. In the case of said leadframe, the lower surface of the chip island 24 is the drain terminal 28 of the semiconductor device 21. Two leads 25 can be seen in FIG. 2. The left-hand lead is the source lead 26 and the right-hand lead is the gate lead 27. The arrangement of the leads 25 and the chip island 24 can be seen in the plan view of FIG. 3.

The semiconductor component 2 has a front side metallization 5 according to an embodiment having two regions 10, 11 of different thickness and a rear side metallization 6. The semiconductor component 2 is mounted on the chip island by means of the rear side metallization 6. The rear side metallization 6 is mechanically and electrically connected to the upper side of the chip island 24 by means of a diffusion solder connection.

The first region 10 of the front side metallization 5, which forms the source contact area 15, is significantly thicker than the second region 11, which forms the gate contact area 16. The source contact area 15 is thus further away from the top side 3 of the semiconductor body 2 of the semiconductor component 1 and from the top side of the chip island 24 than the gate contact area 16. The gate contact area 16 and consequently the gate electrode area 9 are electrically connected to the inner region of the gate lead 27 by means of a gold bonding wire 29. The bonding wire 29 has a diameter of 50 μm.

The source contact area 15 and the source electrode area 8 are electrically connected to the source lead 26 by means of a contact clip 30. The contact clip 30 is connected by means of a soft solder layer 31 to the surface 15 of the second region 10 and the inner region of the source lead 27.

The contact clip 30 has a flat region 33 and a leg 34 projecting from an edge of the flat region 33. The underside of the flat region 33 is mounted on the source contact surface 15 and the leg 34 extends in the direction of the leadframe 22. The underside of the leg 34 is mechanically and electrically connected to the source lead 25.

Owing to the difference between the thickness of the first region 10 and the second region 11 of the front side metallization 5, the end of the flat region 33 of the contact clip 30 projects beyond the bonding wire 29. The lower side of the end of the flat region 33 thus lies above the bonding wire 29 and is not in direct contact with the bonding wire 29. The semiconductor component 1, the chip island 24, the contact clip 30, the bonding wire 29 and the upper sides of the inner regions of the leads 25 are embedded in a plastic housing composition 32. The plastic housing composition 32 provides electrical insulation between the contact clip 30 and the underlying bonding wire 29.

The outer surfaces of the plastic housing composition 32 form the outer contours of the semiconductor device 21 and they form together with the leadframe 22 a JEDEC housing, a so-called power SO housing. The lower surfaces of the leadframe 22 are free of the plastic housing composition 32 and provide the external contact terminals of the semiconductor device 21.

Figure 3:
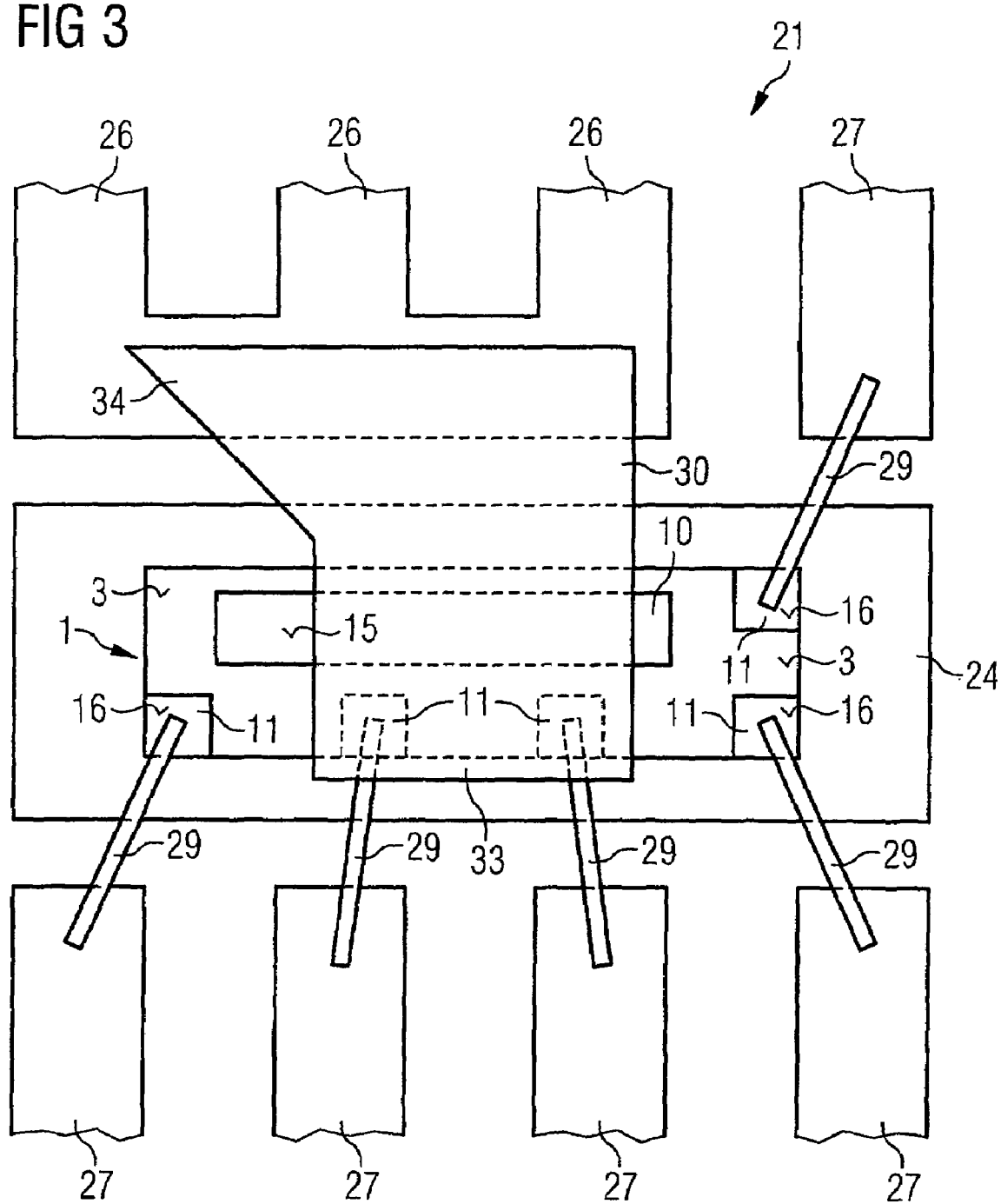
FIG. 3 shows a plan view of the semiconductor device from FIG. 2.

FIG. 3 shows a plan view of the semiconductor device 21 from FIG. 2. The chip island 24 is rectangular and four leads 25 are in each case arranged alongside the two long sides of the chip island 24. At one side, the inner ends of three adjacent source leads 26 are connected to one another and provide a larger internal contact area. The further five leads 25 are gate leads 27.

The rear side of the semiconductor component 1 is mounted on the chip island 24. The top side 3 of the semiconductor component 1 has a larger rectangular source contact area 15 arranged alongside the source lead 25, and also five smaller gate contact areas 16 arranged in the edge regions of the top side alongside the gate lead 27. The underside of the chip island 24 provides the drain terminal 24.

The gate contact areas 16 are in each case electrically connected by means of a bonding wire 29 to a lead 27 lying alongside the gate contact area 16.

Owing to the greater thickness of the source metallization 10, the free end of the flat region 33 of the contact clip 30 lies above two centrally arranged gate contact areas 16 and also their bonding wire connections 29, which are arranged at the opposite side of the semiconductor component 1. The contact clip 30 is not in direct contact with the bonding wires 29. The front side metallization 5 according to an embodiment having two regions 10, 11 of different thickness thus has the advantage that the mounting of the semiconductor device is simplified since the source metallization functions as electrical contact and also spacer.

After the mounting of the rear side 21 of the semiconductor component 1 onto the chip island 24 by means of a diffusion solder method, the bonding wire connections 29 are produced between the gate contact areas 16 and the gate lead 27. The contact clip 30 is then mounted on the source contact area 15 and also onto the source lead 26 by means of soft solder. The semiconductor component 1, the contact clip 30 and the bonding wires 29 and the top side of the inner regions of the leads 25 are embedded in the plastic housing composition (not shown in FIG. 3).

LIST OF REFERENCE SYMBOLS

1 Semiconductor component
2 Semiconductor body
3 Top side
4 Rear side
5 Front side metallization
6 Rear side metallization
7 Drain electrode area
8 Source electrode area
9 Gate electrode area
10 First region
11 Second region
12 Intermediate layer
13 Diffusion solder connection
14 Contact layer
15 Surface of the first region
16 Surface of the second region
17 Intermediate layer on the rear side
18 Contact layer on the rear side
19 Diffusion solder connection
20 Diffusion solder layer
21 Semiconductor device
22 Leadframe
23 Contact elements
24 Chip island
25 Lead
26 Source lead
27 Gate lead
28 Drain terminal
29 Bonding wire
30 Contact clip
31 Soft solder layer
32 Plastic housing composition
33 Flat region of the contact clip
34 Leg of the contact clip

What is claimed is:

1. A vertical power semiconductor component comprising a top side and a rear side, the top side having at least one first electrode contact area and at least one control electrode area and the rear side having a second electrode contact area, and
   a first metallization having a thickness a being arranged on the first electrode contact area,
   a second metallization having a thickness b being arranged on the control electrode area, and
   a third metallization having a thickness c being arranged on the second electrode contact area,
   wherein
   the thickness a of the first metallization on the first electrode contact area is at least 10 times thicker than the thickness b of the second metallization on the control electrode area.

2. The vertical power semiconductor component according to claim 1, wherein $10\ \mu m \leqq a \leqq 500\ \mu m$.

3. The vertical power semiconductor component according to claim 1, wherein $10\ nm \leqq b \leqq 10\ \mu m$.

4. The vertical power semiconductor component according to claim 1, wherein $10\ nm \leqq c \leqq 500\ \mu m$.

5. The vertical power semiconductor component according to claim 1, wherein the semiconductor body of the vertical power semiconductor component has a thickness d, the ratio d/(a+c) being less than 1.

6. The vertical power semiconductor component according to claim 1, wherein $1\ \mu m \leqq d \leqq 1000\ \mu m$.

7. The vertical power semiconductor component according to claim 1, wherein a diffusion solder layer is arranged on the outer surface of the third metallization on the second electrode contact area.

8. The vertical power semiconductor component according to claim 1, wherein the first metallization has an intermediate layer and a contact layer, the contact layer being at least 10 times thicker than the intermediate layer.

9. The vertical power semiconductor component according to claim 1, wherein the third metallization has an intermediate layer and a contact layer, the contact layer being at least 10 times thicker than the intermediate layer.

10. The vertical power semiconductor component according to claim 8, wherein the intermediate layer has a thickness e, where $10\ nm \leqq e \leqq 10\ \mu m$.

11. The vertical power semiconductor component according to claim 8, wherein the contact layer is mounted on the intermediate layer by means of a diffusion solder connection.

12. The vertical power semiconductor component according to claim 8, wherein the intermediate layer has one or more of the elements Ti, Cr, Al, Ni, Au, Ag.

13. The vertical power semiconductor component according to claim 8, wherein the contact layer has Cu or a copper alloy.

14. The vertical power semiconductor component according to claim 1, wherein the second metallization has one or more of the elements Ti, Cr, Al, Ni, Au, Ag.

15. The vertical power semiconductor component according to claim 1, wherein the vertical power semiconductor component is a MOSFET or an IGBT or a BJT.

16. A semiconductor device having the following features:
- at least one vertical power semiconductor component according to claim 1,
- a circuit carrier having at least one chip island, at least one control lead, at least one first lead and at least one second lead, and
- a plurality of contact elements,
- the rear side of the vertical power semiconductor component being mounted on the chip island, and the first electrode contact area being electrically connected to the first lead and the control electrode area being electrically connected to the control lead via the contact elements.

17. The semiconductor component according to claim 16, wherein the first electrode contact area is electrically connected to the first lead by means of a contact clip.

18. The semiconductor component according to claim 16, wherein the control electrode area is electrically connected to the control lead by means of at least one bonding wire.

19. The semiconductor component according to claim 16, wherein the contact element extending between the first electrode contact area and the first lead lies above at least one contact element extending between the control electrode area and the control lead.

20. The semiconductor component according to claim 16, wherein the semiconductor device furthermore has a plastic housing composition.

21. The semiconductor component according to claim 16, wherein the semiconductor device furthermore has a JEDEC housing.

22. A method for producing a vertical power semiconductor component, having the following steps:
- providing at least one semiconductor body having a top side and a rear side, the top side having at least one first electrode contact area and at least one control electrode area,
- applying an intermediate layer of a first metallization having a thickness e on the first electrode contact area,
- applying a second metallization having a thickness b on the control electrode area,
- applying a contact layer of the first metallization on the intermediate layer of the first electrode contact area, the thickness a of the first metallization being at least 10 times thicker than the thickness b of the second metallization,
- reducing the thickness of the semiconductor body to a thickness d by removal of the surface of the rear side of the semiconductor body, and
- applying a third metallization having a thickness c on the rear side of the semiconductor body.

23. The method according to claim 22, wherein the second metallization is applied with a thickness of 10 nm≦b≦10 µm.

24. The method according to claim 22, wherein the first metallization is applied with a thickness of 10 µm≦a≦500 µm.

25. The method according to claim 22, wherein the third metallization is applied with 10 nm≦c≦500 µm.

26. The method according to claim 22, wherein the semiconductor body is reduced to a thickness d, the ratio d/(a+c) being less than 1.

27. The method according to claim 22, wherein the semiconductor body is reduced to a thickness d, where 1 µm≦d≦1000 µm.

28. The method according to claim 22, wherein a diffusion solder layer is applied on the outer surface of the third metallization on the second electrode contact area.

29. The method according to claim 22, wherein the contact layer of the first metallization is at least 10 times thicker than the intermediate layer of the first metallization.

30. The method according to claim 22, wherein an intermediate layer and a contact layer are applied as the third metallization, the contact layer being at least 10 times thicker than the intermediate layer.

31. The method according to claim 22, wherein the intermediate layer is applied with a thickness e on the first electrode contact area and/or the intermediate layer is applied with a thickness e on the second electrode contact area, where 10 nm≦e≦10 µm.

32. The method according to claim 22, wherein the intermediate layers and the second metallization are applied by means of vapor deposition or sputtering.

33. The method according to claim 29, wherein the contact layer of the first metallization and the contact layer of the third metallization are applied in the form of a foil.

34. The method according to claim 33, wherein the foil is applied by means of diffusion solder on the intermediate layer of the first metallization and/or on the intermediate layer of the third metallization.

35. A method for producing a semiconductor device, having the following steps:
- provision of at least one vertical power semiconductor component according to claim 1,
- provision of a circuit carrier having at least one chip island, at least one control lead, at least one first lead and at least one second lead,
- mounting of the rear side of the power semiconductor component on the chip island, and
- production of electrical connections, the first electrode contact area being electrically connected to the first lead and the control contact area being electrically connected to the control lead by means of contact elements.

36. The method according to claim 35, wherein the rear side of the power semiconductor component is mounted on the chip island by means of a diffusion solder connection.

37. The method according to claim 35, wherein the first electrode contact area is electrically connected to the first lead by means of a contact clip.

38. The method according to claim 35, wherein the control contact area is electrically connected to the control lead by means of at least one bonding wire.

39. The method according to claim 35, wherein the contact elements are arranged in such a way that the contact element extending between the first electrode contact area and the first lead lies above at least one contact element extending between the control contact area and the control lead.

40. The method according to claim 35, wherein the power semiconductor component and the contact elements are at least partly embedded in a plastic housing composition.

* * * * *